(12) United States Patent
Shin et al.

(10) Patent No.: US 7,934,177 B2
(45) Date of Patent: Apr. 26, 2011

(54) METHOD AND SYSTEM FOR A PATTERN LAYOUT SPLIT

(75) Inventors: Jaw-Jung Shin, Hsin-Chu (TW);
King-Chang Shu, Banciao (TW);
Tsai-Sheng Gau, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 348 days.

(21) Appl. No.: 11/671,866

(22) Filed: Feb. 6, 2007

(65) Prior Publication Data
US 2008/0189672 A1   Aug. 7, 2008

(51) Int. Cl.
*G06F 17/50* (2006.01)
(52) U.S. Cl. ........................................................ 716/55
(58) Field of Classification Search .............. 716/19–21, 716/30–139
See application file for complete search history.

(56) References Cited

U.S. PATENT DOCUMENTS

| | | | |
|---|---|---|---|
| 6,335,981 B1 * | 1/2002 | Harazaki | 382/144 |
| 6,541,166 B2 | 4/2003 | Mansfield et al. | |
| 2002/0076622 A1 * | 6/2002 | Pierrat et al. | 430/5 |
| 2002/0124235 A1 * | 9/2002 | Yamashita | 716/19 |
| 2007/0031738 A1 * | 2/2007 | Huckabay | 430/5 |
| 2007/0031740 A1 * | 2/2007 | Chen et al. | 430/5 |

FOREIGN PATENT DOCUMENTS

WO   2006-124879 A2   11/2006

OTHER PUBLICATIONS

Chinese Patent Office, Office Action mailed Nov. 6, 2009, 4 pages, for Application No. 2007101294093.

\* cited by examiner

*Primary Examiner* — Vuthe Siek
*Assistant Examiner* — Aric Lin
(74) *Attorney, Agent, or Firm* — Haynes and Boone, LLP

(57) ABSTRACT

A method for splitting a pattern layout including providing the pattern layout having features, checking the pattern layout to determine the features that require splitting, coloring the features that require splitting with a first and second color, resolving coloring conflicts by decomposing the feature with the coloring conflict and coloring the decomposed feature with the first and second color, and generating a first mask with features of the first color and a second mask with features of the second color.

22 Claims, 14 Drawing Sheets

METHOD AND SYSTEM FOR A PATTERN LAYOUT SPLIT

BACKGROUND

The present disclosure relates generally to the manufacturing of semiconductor devices, and more particularly to a photolithography process in semiconductor manufacturing.

Photolithography is frequently used for forming the components of integrated circuits. Generally, an exposure tool includes a photomask or reticle, through which light beams pass through and are focused by a projection lens onto a wafer, resulting in an image of the integrated circuits in a photoresist layer of the wafer.

There has been a continued increase in the density of devices that can be placed on a chip and as a result, the printing of device feature patterns with extremely small spacings is required. However, there is a minimum pitch printing resolution limit which is determined by the wavelength of the light beam and the numerical aperture of the exposure tool. The pitch is the distance from one device feature to the next adjacent device feature. If the pitch becomes too small, the projected image may be distorted by so called "proximity effects" that are associated with the diffraction of light.

Therefore, what is needed is an improved and cost-effective method for satisfying minimum pitch requirements of current photolithography tools.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
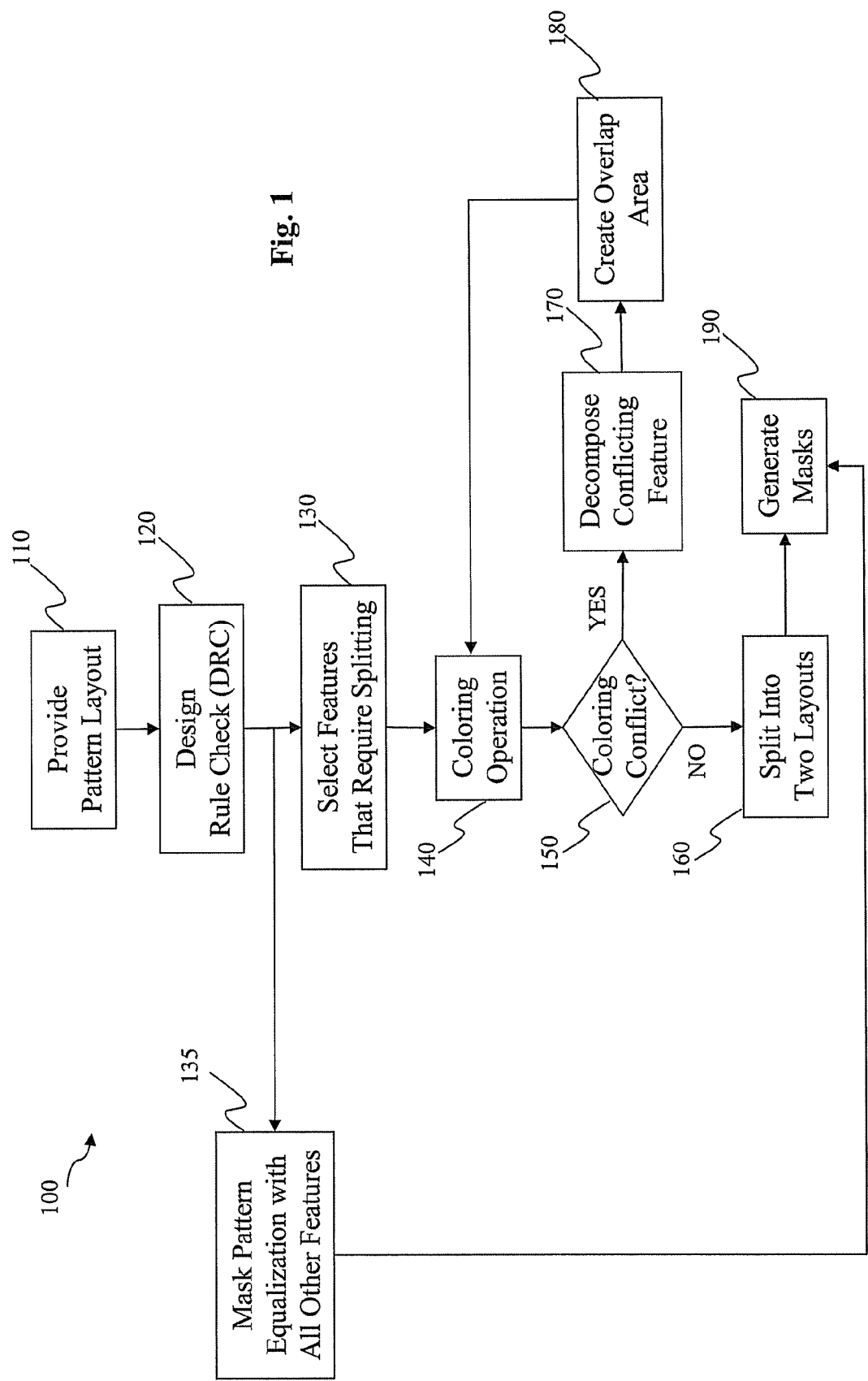
FIG. 1 is a flow chart of a method for splitting a pattern layout according to one embodiment of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring now to FIG. 1, a method 100 for splitting a pattern layout (also referred to as a design layout) into two separate layouts is shown. The method 100 begins with step 110 in which a pattern layout for an integrated circuit is provided. The pattern layout may be provided in a computer aided design format such as GDS format. The pattern layout defines the layout of devices, metal lines, via connections, trenches, and other special circuit designs of the integrated circuit. Typically, the integrated circuit is fabricated using multiple pattern layouts that define the layers of the integrated circuit. In the present embodiment, a single pattern layout is disclosed for simplicity and clarity. However, it is understood that the method disclosed herein is intended to be implemented with all the pattern layouts of the integrated circuit. The pattern layout may comprise of features (or patterns) such as polygate lines, metal lines, contacts, trenches, or other circuit design features known in the art. These features may be shaped as lines, line ends, contact holes, elbow shapes, T-shapes, or other suitable polygons.

The method 100 continues with step 120 in which a design rule check (DRC) is performed on the pattern layout to determine whether the pattern layout complies with a set of design rules. This is done to ensure that the pattern layout leads to good production yield and/or reliable product performance. The design rules specify parameters such as line width, spacing between lines, contact size, via diameter, and the spacing between adjacent features defined on a mask. The present embodiment is concerned with the design rule specifying the spacing between adjacent features (also referred to as the pitch) defined on the mask. The features defined on the mask represent the pattern layout and the mask is used to print an image of the pattern layout into a photoresist layer of a wafer during photolithography. However, there may be a minimum pitch printing resolution for the photolithography system as is discussed in detail below.

The resolution in photolithography may be defined as the ability to discretely discern pairs of closely spaced features or patterns on a wafer, for example, equal lines and spaces. Resolution is a critical parameter because of the need to print extremely small features along with high packing density for these features in advanced IC semiconductor fabrication. The resolution of an optical system may be expressed as $R=k\lambda/NA$, where k is the process factor of the optical system; $\lambda$ is the wavelength of the light source; and NA is the numerical aperture of the projection lens. As an example, k may range between 0.3 to about 0.8, $\lambda$ may range between 150 to about 400 nm, and NA may range between 0.6 to about 1.5. It is understood that the values provided herein are mere examples and that other values and/or combination of values may be used depending on the type of optical system and semiconductor application.

From the equation above, the resolution of the smallest printable feature can be predicted for any given optical system. Thus, for a given optical system, there is a minimum pitch, or minimum distance between adjacent features, that must be complied with in order to prevent distortion when printing features of the pattern layout. The minimum pitch includes a minimum pitch of a space/line for adjacent lines, a minimum space between a first line end and an a second line end (or line ends), and a minimum pitch for adjacent contacts. For the sake of example, a polysilicon gate (or polygate) layer with a line width of 90 nm may have a minimum pitch of 290 nm for adjacent lines and a minimum space of 170 nm between line ends. Accordingly, adjacent lines that have a smaller pitch than 290 nm or line ends that have a smaller space than 170 nm may be distorted when printed in a photoresist layer of the wafer. It is understood that the use of a polygate layer is a mere example and that other features or patterns such as metal line patterns, trench patterns, contact hole patterns, and other circuit design patterns may be used.

Figure 2:
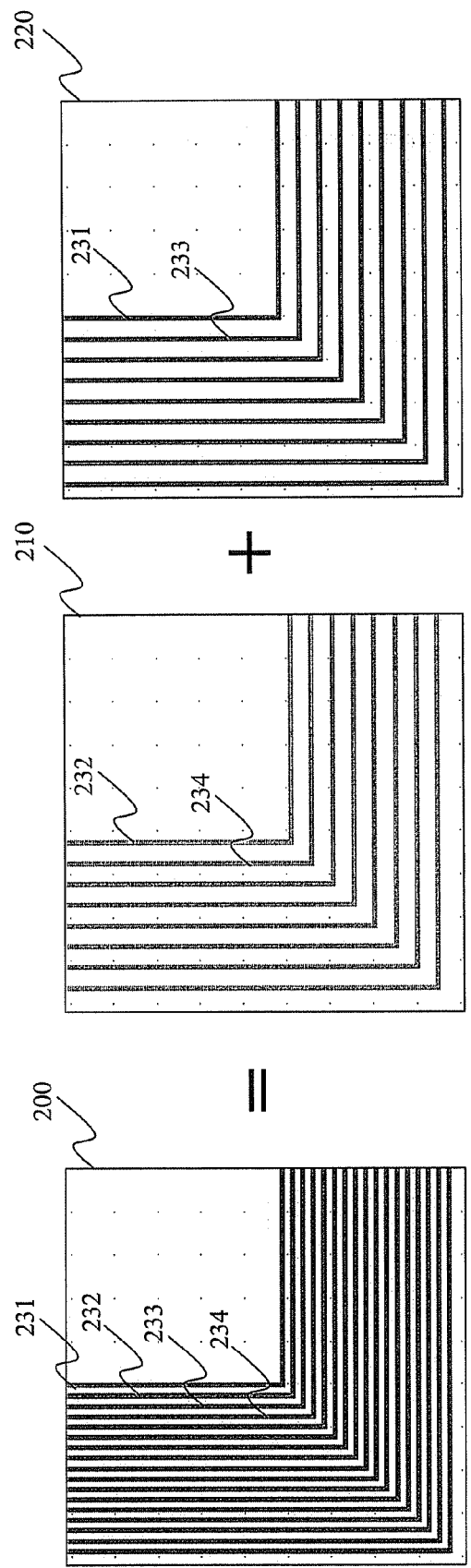
FIG. 2 is an example of a pattern layout that is split into two separate layouts according to a minimum pitch for adjacent lines.

The method 100 continues with step 130 in which the patterns or features that require splitting are selected. These are the features of the pattern layout that do not meet the design rule that specifies the minimum pitch or spacing for the given optical system. Additionally, all other features that do not require splitting may undergo a mask pattern equalization in step 135 which will be described in more detail later. Now referring also to FIG. 2, illustrated is an example of a pattern layout 200 that is split into two separate layouts 210, 220 according to a minimum pitch for adjacent lines. For the sake of example, the design rule for a polysilicon gate layer as discussed above may be implemented on the pattern layout 200. A design rule for a minimum pitch for adjacent lines may be 290 nm. The pattern layout 200 comprises features of parallel polygate lines that are patterned as elbow lines 231, 232, 233, 234 (only 4 features are numbered in this example). The first elbow line 231 may be evaluated with features that are adjacent to it, the only one being the second elbow line 232. The first elbow line 231 and the second elbow line 232 are checked and determined to have a pitch of 240 nm. Since this pitch is less than the minimum pitch of 290 nm for adjacent lines, the first elbow line 231 and the second elbow line 232 are selected to be split into two separate layouts. Accordingly, the first elbow line 231 is added to the first layout 210 and the second elbow line 232 is added to the second layout 220.

Next, the second elbow line 232 may be evaluated with features that are adjacent to it, those being the first elbow line 231 and the third elbow line 233. The second elbow line 232 has already been evaluated with the first elbow line 231 as discussed above. Accordingly, the second elbow line 232 and the third elbow line 233 are checked and determined to also have a pitch of 240 nm. Since this pitch is less than the minimum pitch of 290 nm for adjacent lines, the second elbow line 232 and third elbow line 232 are selected to be split into two separate layouts. Because the second elbow line 232 was already added to the second layout 220 from the previous split, the third elbow line 233 is added to the first layout 210 as shown.

Next, the third elbow line 233 may be evaluated with features that are adjacent to it, those being the second elbow line 232 and the fourth elbow line 234. The third elbow line 233 has already been evaluated with the second elbow line 232 as discussed above. Accordingly, the third elbow line 233 and the fourth elbow line 234 are checked and determined to also have a pitch of 240 nm. Again, since this pitch is less than the minimum pitch of 290, the third elbow line 233 and fourth elbow line 234 are selected to be split into two separate layouts. Because the third elbow line 233 was already added to the first layout 210 from the previous split, the fourth elbow line 234 is added to the second layout 220 as shown.

This procedure is performed on all the features of the pattern layout 200 and results in two separate layouts 210, 220 being generated as shown. The first layout 210 now comprises parallel elbow lines 231, 233 that have a pitch of 480 nm and the second layout 220 now comprises parallel elbow lines 232, 234 that also have a pitch of 480 nm. The first layout 210 when combined with the second layout 220 is equivalent to the original pattern layout 200. Since both layouts 210, 220 comply with the minimum pitch rule for adjacent lines in this example, these features when printed into a photoresist layer of a wafer will not be distorted.

Figure 3:
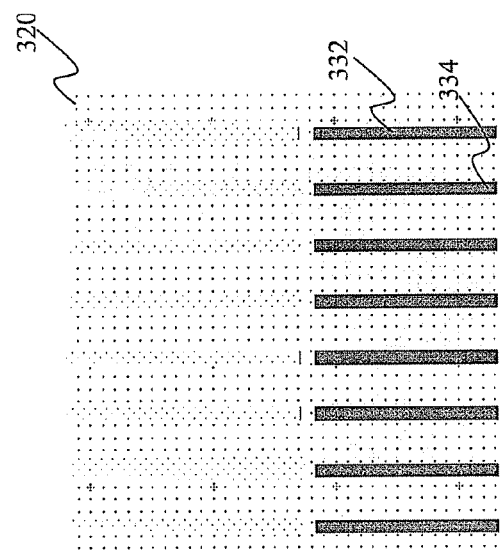
FIG. 3 is an example of a pattern layout that is split into two separate layouts according to a minimum spacing between line ends.
Figure 3:
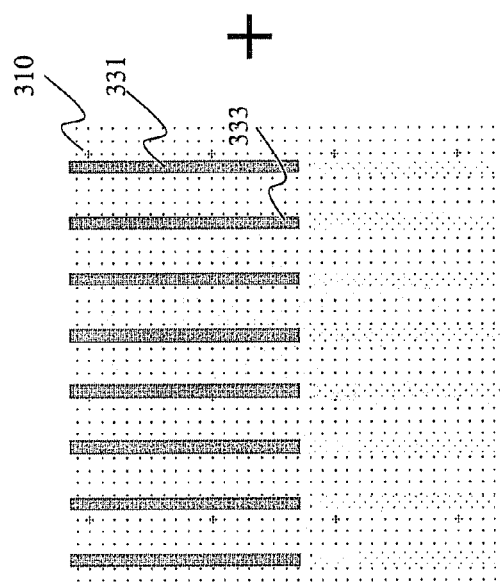
Figure 3:
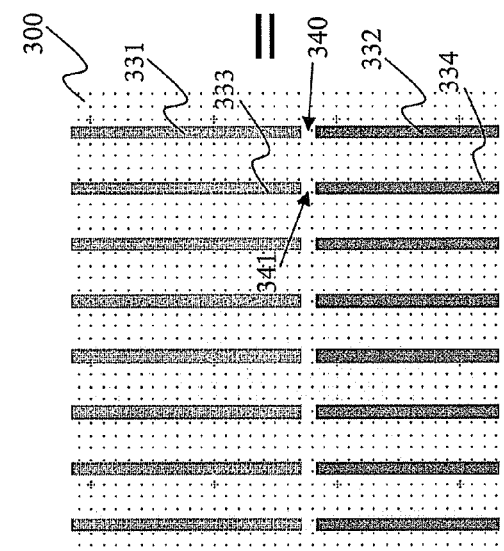

Now referring also to FIG. 3, illustrated is an example of a pattern layout 300 that is split into two layouts 310, 320 according to a minimum spacing between line ends. For the sake of example, a design rule for a polysilicon gate layer as previously discussed may be implemented on the pattern layout 300. The design rule for a minimum spacing between line ends is 170 nm. The pattern layout 300 comprises features of polygate lines that are patterned as lines running end to end 331, 332, 333, 334 (only 4 features are numbered in this example). It is assumed in this example that the minimum pitch for adjacent lines is satisfied but the spacing between line ends is not. The first line 331 and the second line 332 are checked and determined that the spacing 340 between the first line end and the second line end is 100 nm. Since this spacing is less than the minimum spacing of 170 nm, the first line 331 and the second line 332 are selected to be split into two separate layouts. The first line 331 is added to the first layout 310 and the second line 332 is added to the second layout 320 as shown.

Next, the third line 333 and the fourth line 334 are checked and determined that the spacing 341 between the third line end and the fourth line end is 100 nm. Again, since this spacing is less than the minimum spacing of 170 nm, the third line 333 and the fourth line 334 are selected to be split into separate layouts. The third line 333 is added to the first layout 310 and the fourth line 334 is added to the second layout 320 as shown. Alternatively, the third line 330 may optionally been added to the second layout 320 and the fourth line 334 been added to the first layout 310 (not shown).

This procedure is performed on all the features of the pattern layout 300 and results in two separate layouts 310, 320 being generated as shown. The first layout 310 now comprises lines 331, 333 and the second layout 320 now comprises lines 332, 334, both of which do not have spacings between line ends that are less than the minimum spacing of 170 nm. In fact, in this example, there are no longer any spacing between line ends in both layouts 310, 320. The first layout 310 when combined with the second layout 320 is equivalent to the original pattern layout 300. Since both layouts 310, 320 comply with the minimum spacing for line ends in this example, these features or patterns when printed into a photoresist layer of a wafer will not be distorted.

Figure 4:
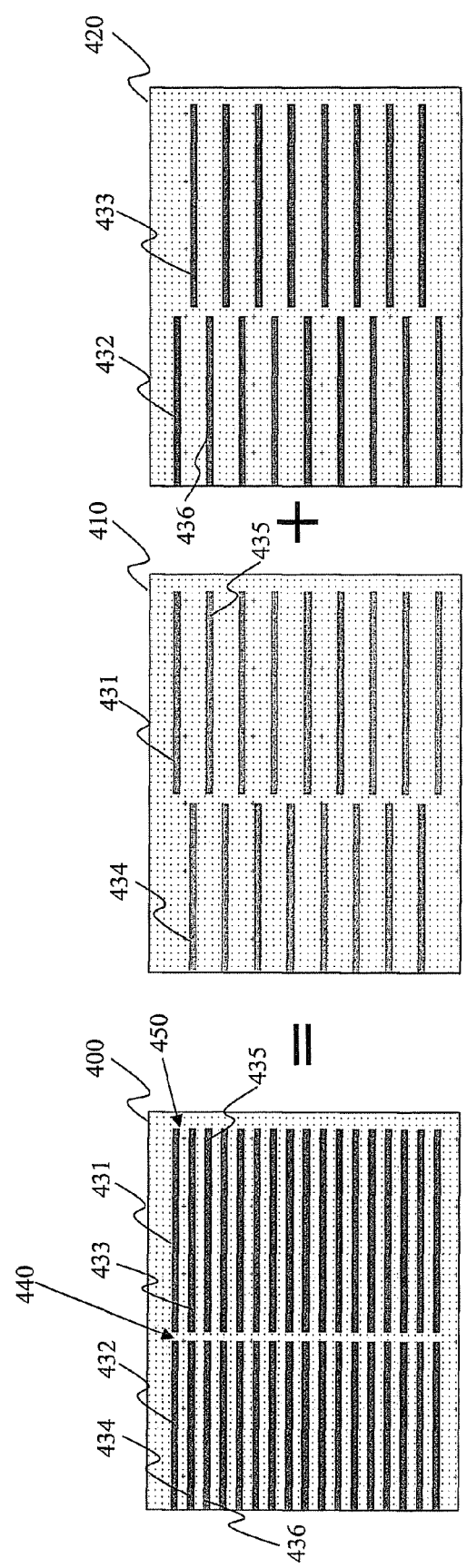
FIG. 4 is an example of a pattern layout that is split into two separate layouts according to the minimum pitch of FIG. 2 and the minimum spacing of FIG. 3.

Now referring also to FIG. 4, illustrated is an example of a pattern layout 400 that is split into two layouts 410, 420 according to a minimum pitch for adjacent lines and a minimum spacing for line ends. For the sake of example, design rules for a polygate layer as previously discussed may be implemented on the pattern layout 400. The design rule for a minimum pitch for adjacent lines is 290 nm and the design rule for a minimum spacing between line ends is 170 nm. The pattern layout 400 comprises features of polygate lines that are patterned as parallel lines running end to end 431, 432, 433, 434, 435, 436 (only 6 features are numbered in this example). The first line 431 may be evaluated with features that are adjacent to it, those being the second line 432 and the third line 433. The first line 431 and the second line 432 are checked and determined that the spacing 440 between the first line end and the second line end is 100 nm (the first and second lines do not have an issue with the minimum pitch for adjacent lines). Since this spacing is less than the minimum spacing of 170 nm, the first line 431 and the second line 432 are selected to be split into two separate layouts. The first line 431 is added to the first layout 410 and the second line 432 is added to the second layout 420 as shown.

Next, the first line 431 and the third line 433 are checked and determined to have a pitch 440 of 240 nm (the first and third lines do not have an issue with the minimum spacing between line ends). Since this pitch is less than the minimum pitch of 290 nm, the first line 431 and the third line 433 are selected to be split into two separate layouts. Because the first line 431 was added to the first layout 410 from the previous split, the third line 433 is added to the second layout 420 as shown. In this example, it is noted that the second line 432 and the third line 433 do not have issues with the minimum pitch for adjacent lines or the minimum spacing between line ends and thus, both can be added to the same layout.

Next, the second line 432 may be evaluated with features that are adjacent to it, those being the first line 431 and the fourth line 434. The second line 432 already has been evaluated with the first line 431 as discussed above. Accordingly, the second line 432 and the fourth line 434 are checked and determined to have a pitch of 240 nm. Since this pitch is less than the minimum pitch of 290 nm, the second line 432 and the fourth line 434 are selected to be split into two separate layouts. Because the second line 432 was added to the second layout 420 from the previous split, the fourth line 434 is added to the first layout 410 as shown. In this example, it is noted that the first line 431 and the fourth line 434 do not have issues with the minimum pitch for adjacent lines or the minimum spacing between line ends and thus, both can be added to the same layout.

Next, the third line 433 may be evaluated with features that are adjacent to it, those being the first line 431, the fourth line 434, and the fifth line 435. The third line 433 has already been evaluated with the first line 431 as discussed above. Additionally, there is no need to evaluate the third line 433 with the fourth line 434 since the third line and the fourth line have been added to separate layouts 410, 420 by previous splits as discussed above. Accordingly, the third line 433 and the fifth line 435 are checked and determined to have a pitch of 240 nm. Since this pitch is less than the minimum pitch of 290 nm, the third line 433 and the fifth line 435 are selected to be split into two separate layouts. Because the third line 433 was added to the second layout 420 from the previous split, the fifth line 435 is added to the first layout 410 as shown. In this example, it is noted that the first line 431, the fourth line 434, and the fifth line 435 do not have issues with the minimum pitch for adjacent lines or the minimum spacing between line ends and thus, all three can be added to the same layout.

Next, the fourth line 434 may be evaluated with features that are adjacent to it, those being the second line 432, the third line 434, and the sixth line 436. The fourth line 434 has already been evaluated with the second line 432 as discussed above. Additionally, there is no need to evaluate the fourth line 434 with the third line 433 since the fourth line and the third line have been added to separate layouts 410, 420 by previous splits as discussed above. Accordingly, the fourth line 434 and the sixth line 436 are checked and determined to have a pitch of 240 nm. Since this pitch is less than the minimum pitch of 290 nm, the fourth line 434 and the sixth line 436 are selected to be split into two separate layouts. Because the fourth line 434 was added to the first layout 410 from the previous split, the sixth line 436 is added to the second layout 420 as shown. In this example, it is noted that the second line 432, the third line 433, and the sixth line 436 do not have issues with the minimum pitch for adjacent lines or the minimum spacing between line ends and thus, all three can be added to the same layout.

This procedure is performed on all the features of the pattern layout 400 and results in two separate layouts 410, 420 being generated as shown. The first layout 410 now comprises lines 431, 434, 435 and the second layout 420 now comprises lines 432, 433, 436, both of which do not have pitches that are less than the minimum pitch of 290 nm and spacings between line ends that are less than the minimum spacing of 170 nm. The first layout 410 when combined with the second layout 420 is equivalent to the original pattern layout 400. Since both layouts 410, 420 comply with the minimum pitch for adjacent lines and the minimum spacing for line ends, these features or patterns when printed into a photoresist layer of a wafer will not be distorted.

Now referring back to FIG. 1, after selecting features of the pattern layout that require splitting, the method 100 continues with step 140 in which a coloring operation is performed on these features. As was previously discussed and illustrated in FIGS. 2-4, the adjacent features that do not meet design rules such as a minimum pitch for adjacent lines or a minimum spacing between line ends are selected to be split into two separate layouts. In this step 140, the adjacent features that require splitting are colored with two colors. One of the features is colored with a first color and the other feature is colored with a second color. These two colors represent the two separate layouts to which these adjacent features will be split into. The coloring operation in step 140 is complete once all the features that require splitting are colored either with the first color or second color.

The method 100 continues with step 150 in which a determination is made as to whether the coloring operation in step 140 created any coloring conflicts. Coloring conflicts occur when two adjacent features that require splitting are colored with the same color. This will be explained and illustrated in greater detail below. If there are no coloring conflicts as was illustrated in FIGS. 2-4, the method 100 continues with step 160 in which the features of the pattern layout are split into two separate layouts. The features that are colored with the first color are added to a first layout and the features that are colored with the second color are added to a second layout.

If there are coloring conflicts following the coloring operation step 140, the method 100 continues with step 170 in which one of the adjacent features having the same color is decomposed into at least two component features and results in a new combination of adjacent features. The decomposition usually occurs at an elbow section of one of the features. The method 100 continues with step 180 in which an overlap area is created at the decomposition location. The new combination of adjacent features are then colored with the first and second colors as was described in step 140. These steps may be repeated until all the coloring conflicts are resolved. The example that follows illustrates a pattern layout with a coloring conflict and how to resolve the coloring conflict with decomposition.

Figure 5A:
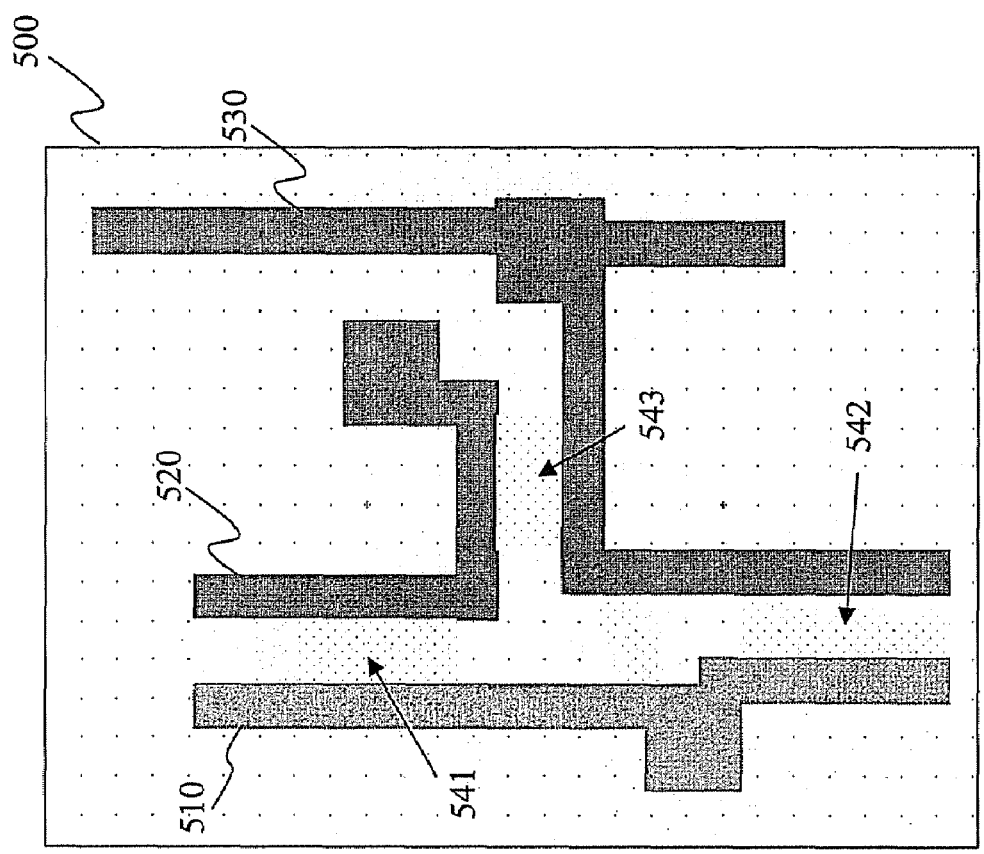
FIGS. 5a-5b are views of a pattern layout having a coloring conflict and undergoing a decomposition process.
Figure 5B:
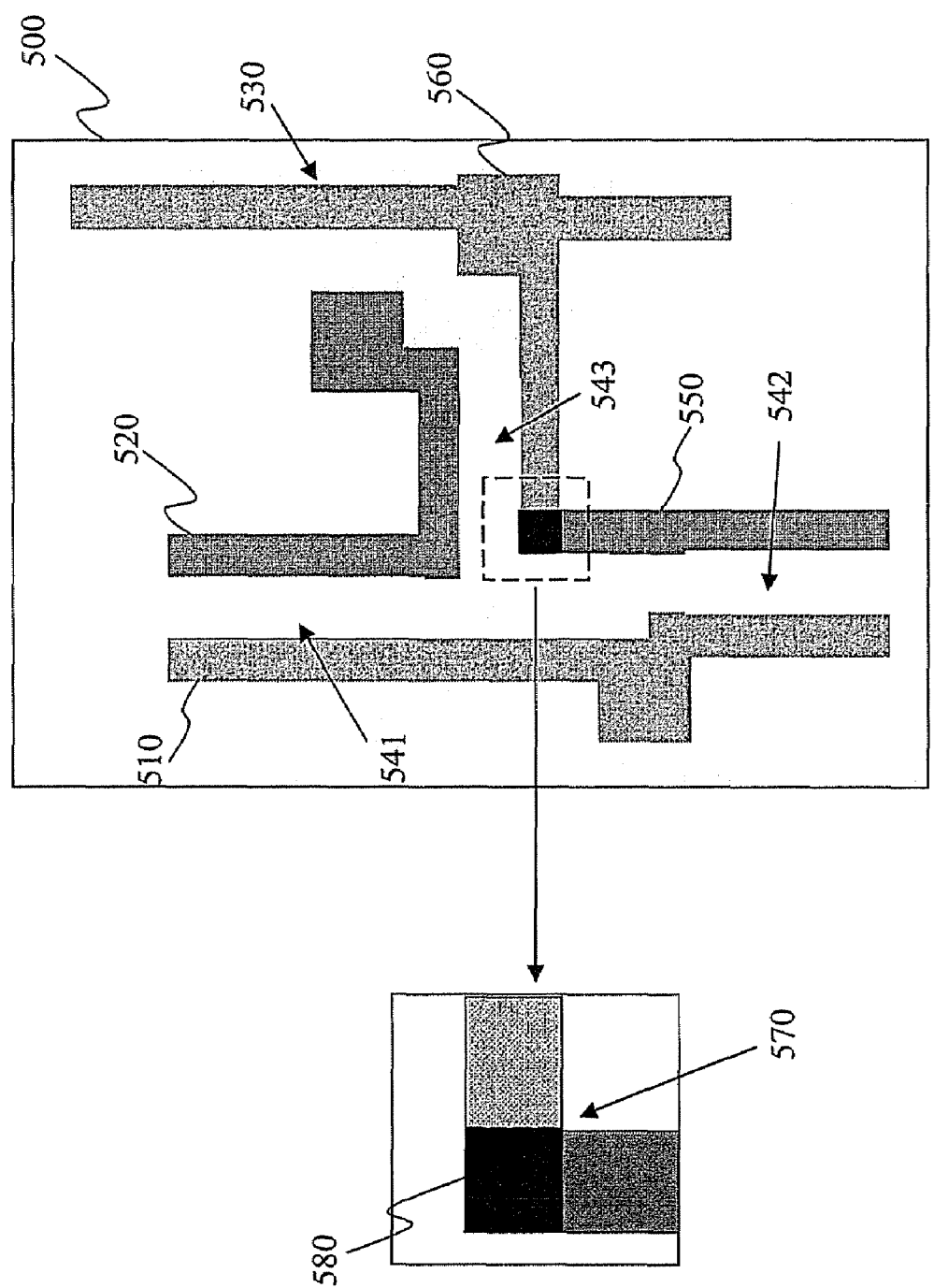

Now referring also to FIGS. 5a-5b, illustrated are views of a pattern layout 500 having a coloring conflict and undergoing the decomposition step 170 of FIG. 1. For the sake of example, the pattern layout 500 represents a polygate layer having polygate features 510, 520, 530 that are shaped as shown. In FIG. 5a, the pattern layout 500 is shown after it has undergone the coloring operation in step 140 of FIG. 1. The first polygate feature 510 and the second polygate feature 520 were checked and determined to have a pitch 541 that was less than a minimum pitch required for adjacent lines. Accordingly, the first polygate pattern 510 is colored with a first color and the second polygate feature 520 is colored with a second color.

Next the first polygate feature 510 and the third polygate feature 530 were checked and determined also to have a pitch 542 that was less than the minimum pitch for adjacent lines. Because the first polygate feature 510 was colored with the first color from the previous split, the third polygate feature 530 is colored with the second color. The coloring operation is complete since all the features 510, 520, 530 of the pattern layout 500 have been colored either with the first color or the second color. However, the second polygate feature 520 and the third polygate feature 530 have a pitch 543 that is also less than the minimum pitch for adjacent lines but these adjacent features 520, 530 have the same color. Thus, there is a coloring conflict between the second polygate feature 520 and the third polygate feature 530.

In FIG. 5b, the pattern layout 500 is shown after it has undergone the decomposition step of 170 to resolve the coloring conflict. One of the adjacent features may be decomposes into at least two components. In this example, the third polygate feature 530 may be decomposed into at least two component features, a first component feature 550 and a second component feature 560. The decomposition is usually performed at an elbow section 570. The coloring conflict was with the second polygate feature 520 which was colored with the second color. Accordingly, the first component feature 550 is colored with the second color and the second component feature 560 is colored with the first color. Additionally, an overlap area 580 is created at the junction of the first component feature 550 and the second component feature 560. The coloring conflict between the second polygate feature 520 and the third polygate feature 530 (now comprised of the first component feature 550 and the second component feature 560) has been resolved.

Figure 6A:
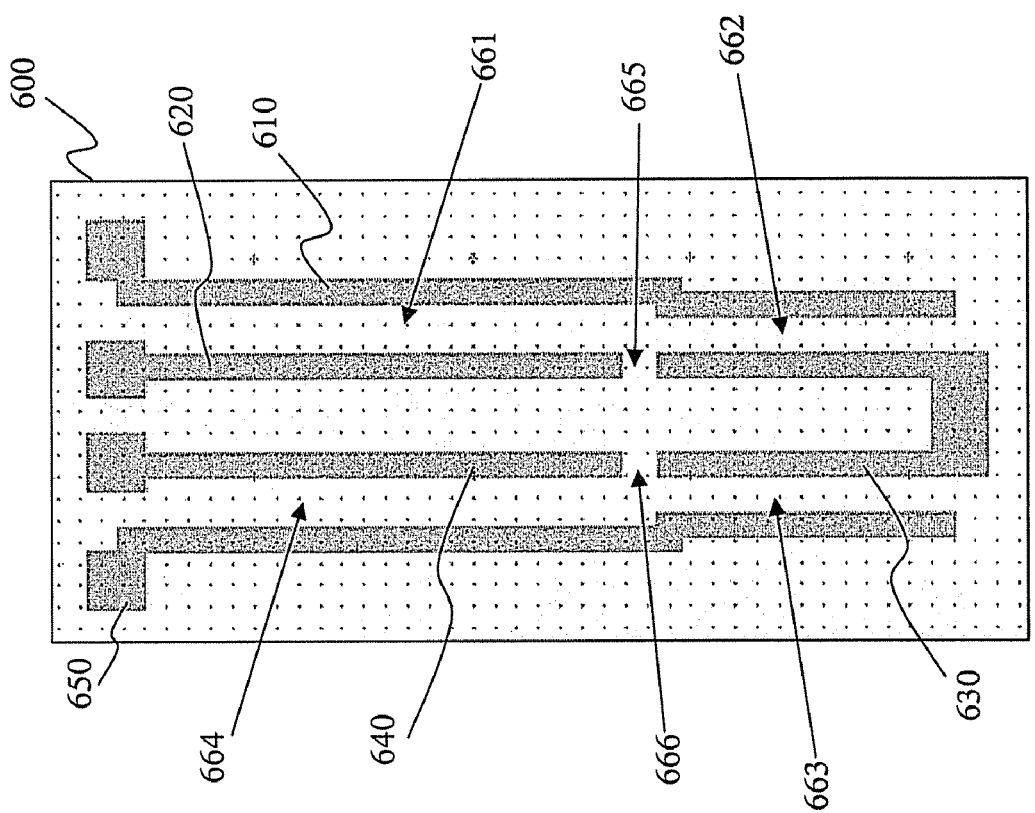
FIGS. 6a-6d are views of a pattern layout undergoing through part of the pattern split method of FIG. 1.
Figure 6B:
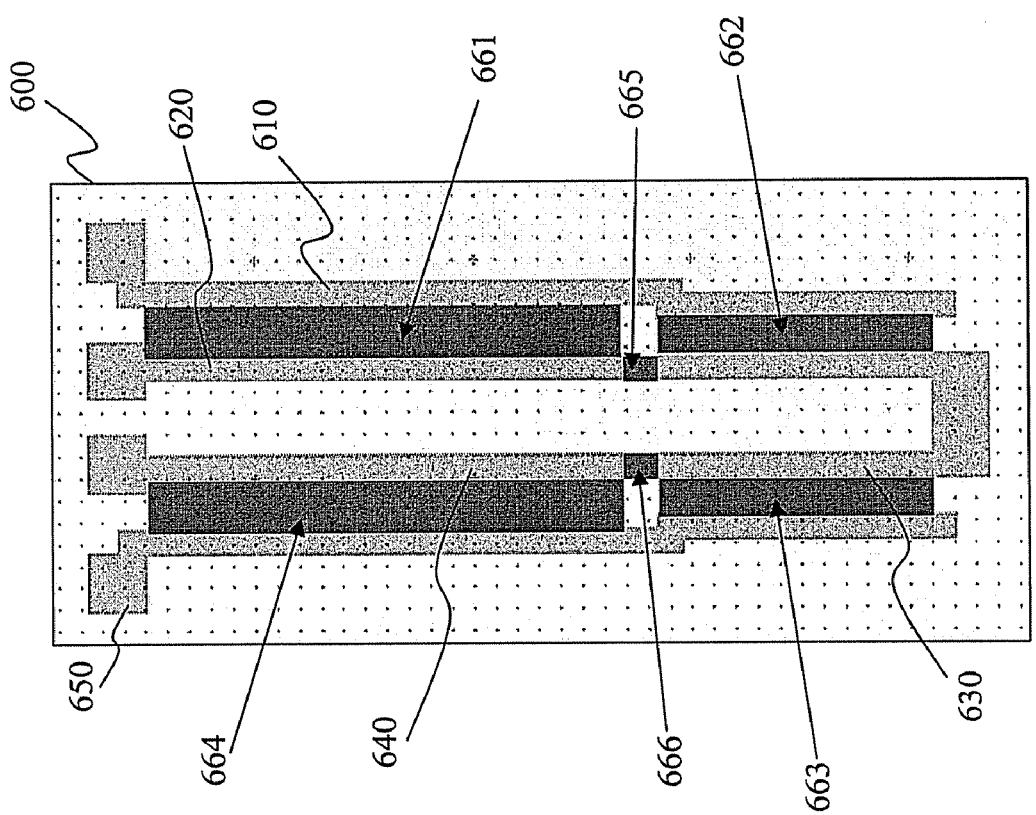

Now referring also to FIGS. 6a-6d, illustrated are views of a pattern layout 600 undergoing through part of the pattern split method of FIG. 1. This is another example of a coloring conflict and resolving the coloring conflict with decomposition. For the sake of example, in FIG. 6a, the pattern layout 600 represents a polygate layer having polygate features 610, 620, 630, 640, 650 that are shaped as shown (step 110 of FIG. 1). A design rule check (DRC) is performed on the pattern layout 600 to determine whether the pattern layout complies with a set of design rules (step 120 of FIG. 1). In the present example, the design rule includes a minimum pitch for adjacent lines and a minimum spacing for line ends. It is determined that all the features 610, 620, 630, 640, 650 require splitting because the pattern layout 600 comprises pitches 661, 662, 663, 664 of adjacent lines and spacings 665, 666 between line ends that do not meet the design rule parameters (step 130 of FIG. 1). In FIG. 6b, the pitches 661, 662, 663, 664 of adjacent lines and the spacings 665, 666 between line ends may be identified with shading to aid in recognizing coloring conflicts created from the coloring operation step 140 of FIG. 1. It is understood that the shading is not part of the coloring operation and is only used to clarify and help in understanding how to recognize coloring conflicts.

Figure 6C:
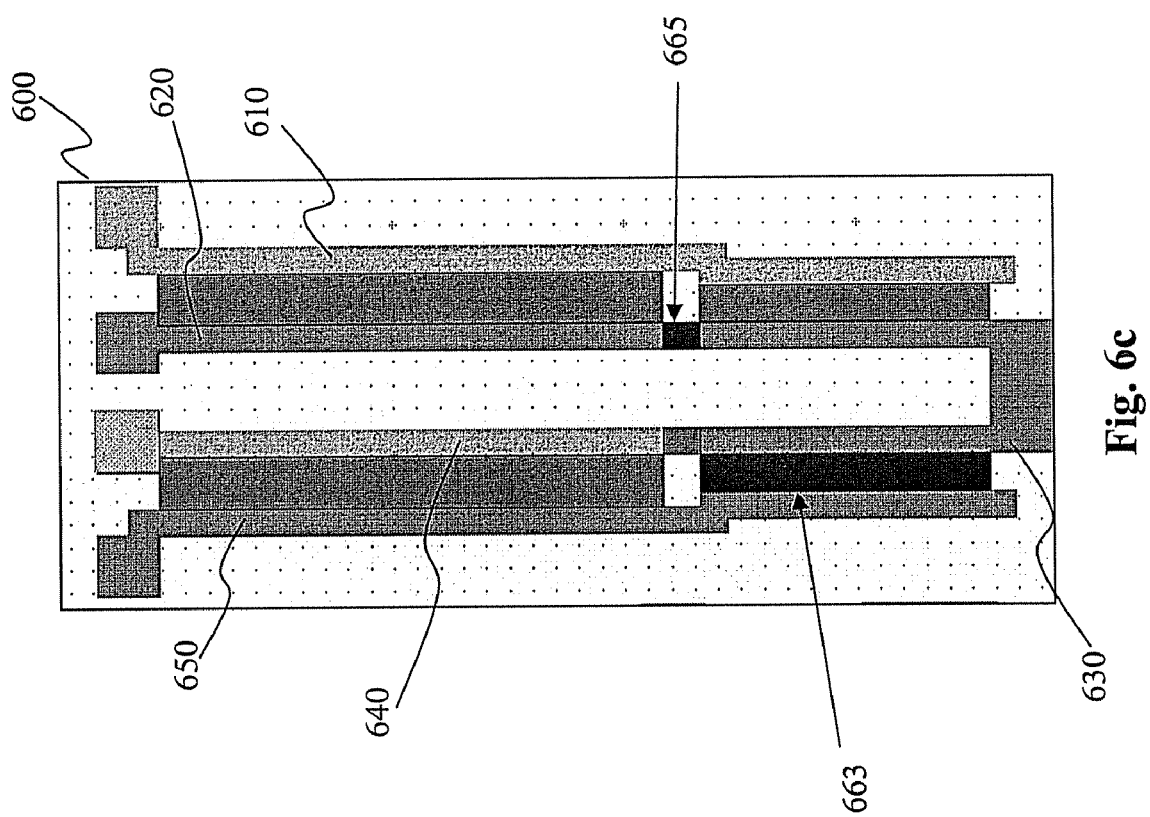
Figure 6D:
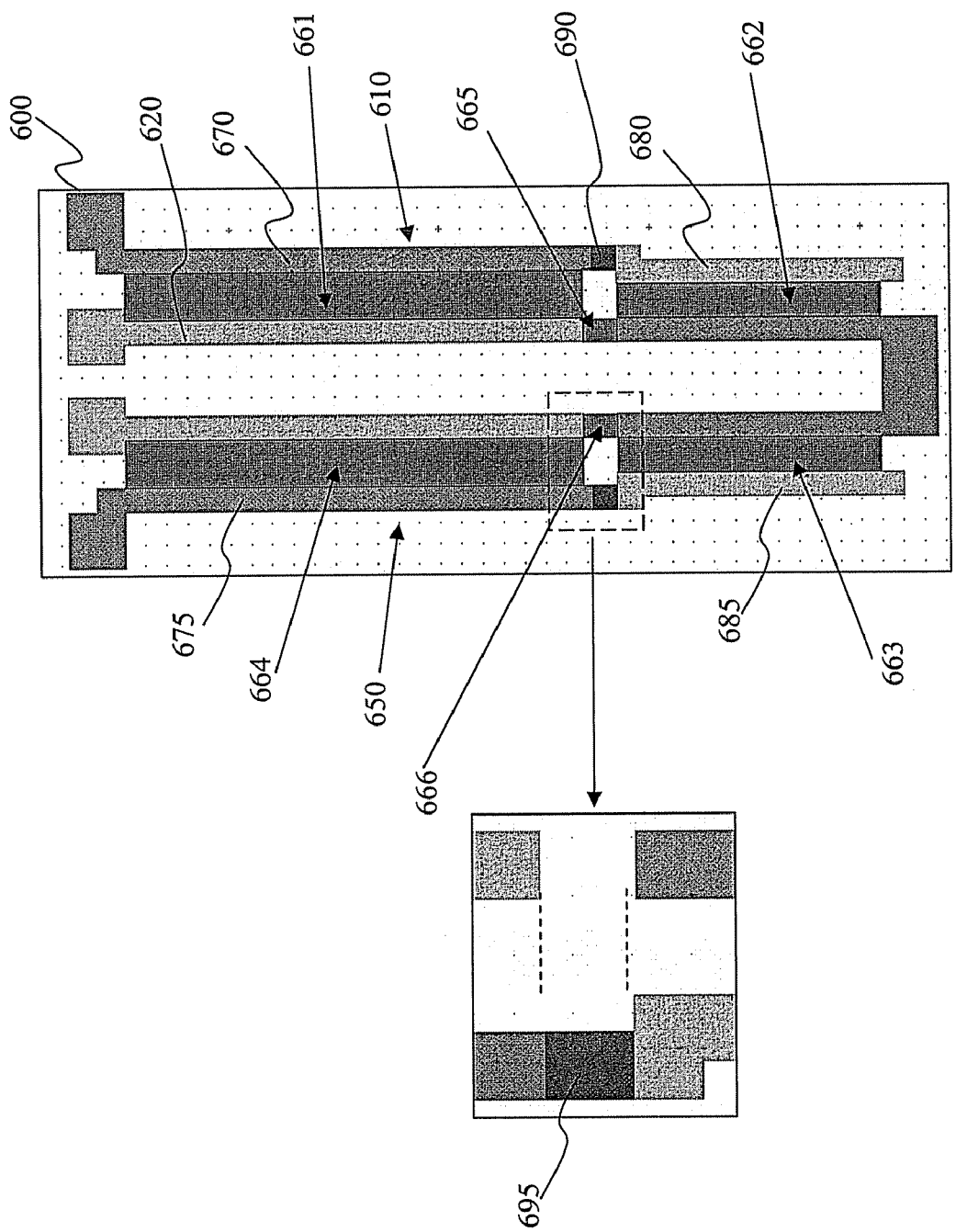

In FIG. 6c, the pattern layout 600 is shown after the coloring operation step 140 of FIG. 1. The first feature 610 and fourth feature 640 are colored with a first color. The second feature 620, third feature 630, and fifth feature 650 are colored with a second color. Coloring conflicts occur when two adjacent features that require splitting are colored with the same color. Accordingly, the coloring conflicts may be identified by checking the shaded regions of pitches 661, 662, 663, 664 and spacings 665, 666 and making sure that the features separated by these shaded regions are of different colors. Thus, the coloring conflicts occur at pitch 663 and spacing 665 (step 150 of FIG. 1). In FIG. 6d, the pattern layout 600 is shown after resolving the coloring conflicts through repeated decomposition and coloring. As a result, the first feature 610 and the fifth feature 650 were decomposed into first component features 670, 675 and second component features 680, 685 at an elbow section (step 170 of FIG. 1). The second feature 620 was re-colored with the first color. Overlap areas 690, 695 were created at the junction between the first feature components 670, 675 and the second feature components 680, 685 (step 180 of FIG. 1). Thus, all the shaded regions of pitches 661, 662, 663, 664 and spacings 665, 666 now separate features of different colors.

Now referring again to FIG. 1, once all coloring conflicts have been resolved (or if no coloring conflicts occurred as previously discussed), the method 100 continues with step 160 in which the features of the pattern layout are split into two separate layouts. The features that are colored with the first color are added to a first layout and the features that are colored with the second color are added to a second layout. The method 100 continues with step 190 in which masks are generated from the two separate layouts. A first mask is generated representing the first layout and a second mask is generated representing the second layout. The process of generating masks from design layouts is well known in the art and thus, is not described in detail herein.

It is noted that the first and second masks are not complete since the first and second layouts only comprise of features that required splitting (the first and second masks are complete in the case where all the features of a pattern layout require splitting). Accordingly, the features of the pattern layout that did not require splitting may be added to the first mask and/or the second mask. Alternatively, these features may be added to the first and second layouts and the first and second masks may be generated therefrom. The process of adding these features so that the first mask and the second mask reach a similar pattern density is described below. By doing this, the quality of the image printed from the masks during photolithography is improved.

As previously mentioned, the features of the pattern layout that do not require splitting may undergo a mask pattern equalization step 135 of FIG. 1. The mask pattern equalization step 135 is illustrated in more detail in FIG. 7. The equalization step 135 begins with step 710 in which a mesh layout may be created. The mesh layout may define different areas of a first and second mask that are available for adding features to. The equalization step 135 continues with step 720 in which the features of the pattern layout that do not require splitting (as discussed in step 120 of FIG. 1) are equalized and assigned to the areas defined in the mesh layout. This is done by equally assigning approximately half of these features to areas of the first mask defined in the mesh layout and assigning the other half to areas of the second mask defined in the mesh layout. Alternatively, the features assigned to areas of the first mask may be colored with the first color and the features assigned to areas of the second mask may be colored with the second color (These features may then be added to the first and second layouts as discussed in step 160 of FIG. 1). The equalization step 135 continues with step 730 in which the features that were assigned to areas of the first mask are equalized into the first mask generated in step 190 of FIG.

1 and the features that were assigned to areas of the second mask are equalized into the second mask generated in step 190 of FIG. 1.

As a result, the first mask and the second mask may have a similar pattern density and are ready to be used for semiconductor manufacture. The first and second masks may be used to project an image of the pattern layout into a photoresist layer of a wafer during photolithography (e.g., exposure of the first mask followed by exposure of the second mask). Since the first and second layouts comply with all design rules that specify minimum pitch and/or spacing for the given optical system, the image generated by the first and second masks can be predicted and thus, will produce successful yields and lead to good wafer performance.

Figure 7:
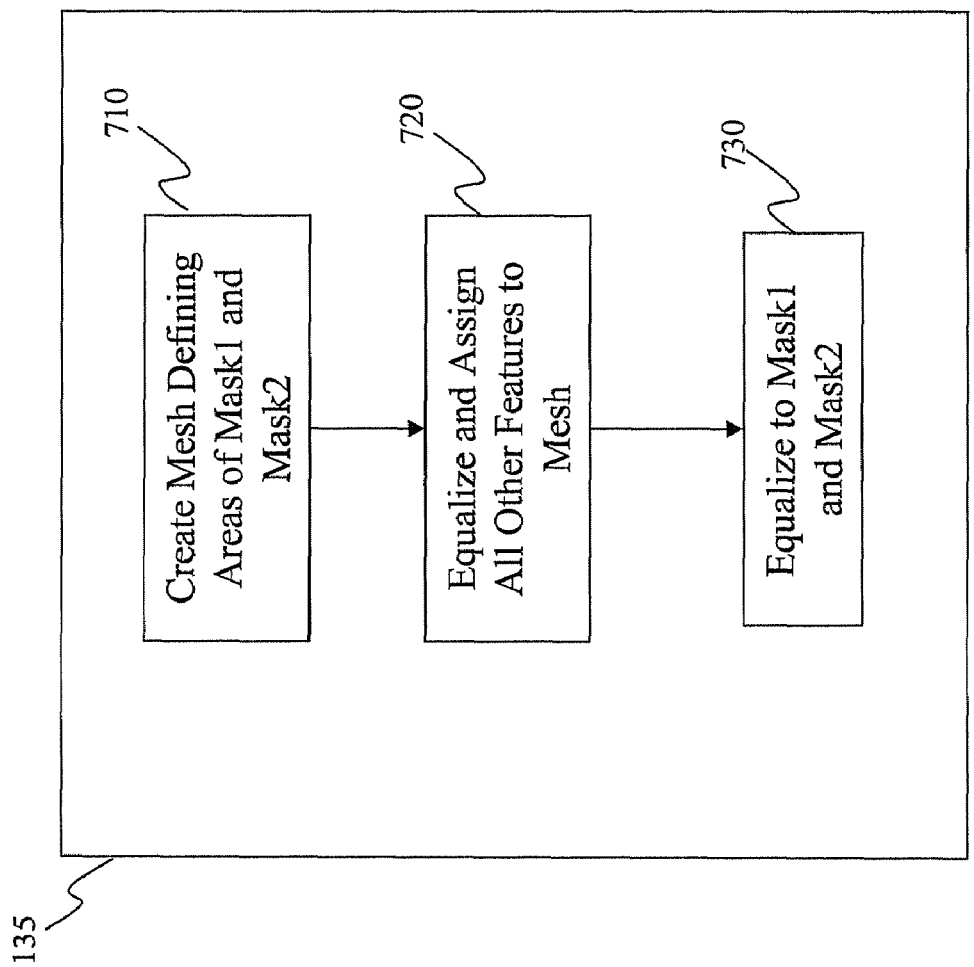
FIG. 7 is a flow chart of a mask pattern equalization step for the method of FIG. 1.
Figure 8:
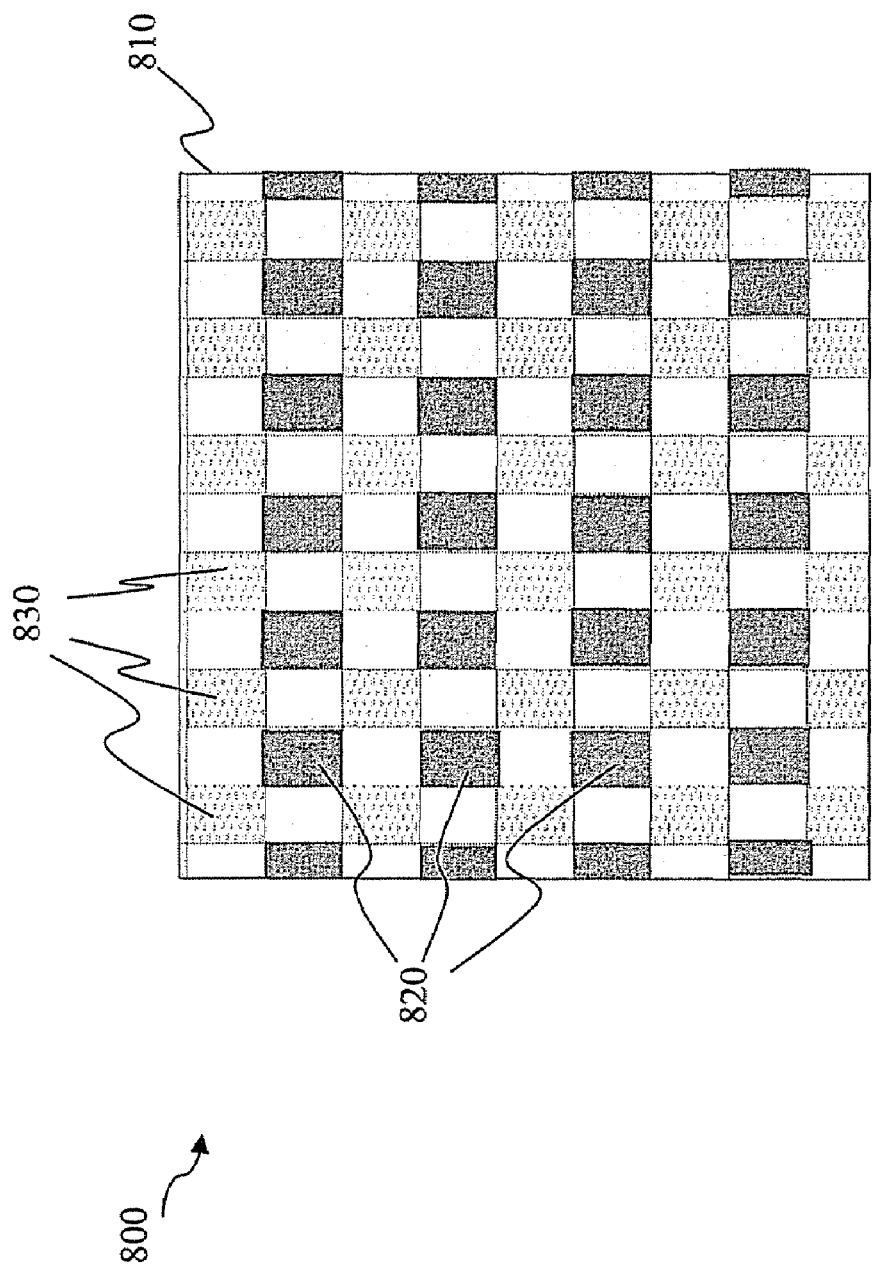
FIG. 8 is an example of a mesh layout used in the mask pattern equalization step of FIG. 7.

Referring now to FIG. 8, illustrated is an example of a mesh layout 800 that may be used in the mask pattern equalization step of FIG. 7. In FIG. 8, the mesh layout 800 represents an entire mask layout 810 and defines different areas 820 of a first mask and different areas 830 of a second mask that are available for adding features to. Even though the mesh layout 800 is shown with a checkered arrangement of areas, it is understood that the arrangement of areas will depend on the specific pattern layout that is being split. Accordingly, the features of a pattern layout that do not require splitting will be equalized and assigned to areas 820 of the first mask and areas 830 of the second mask defined in the mesh layout 800.

Figure 9:
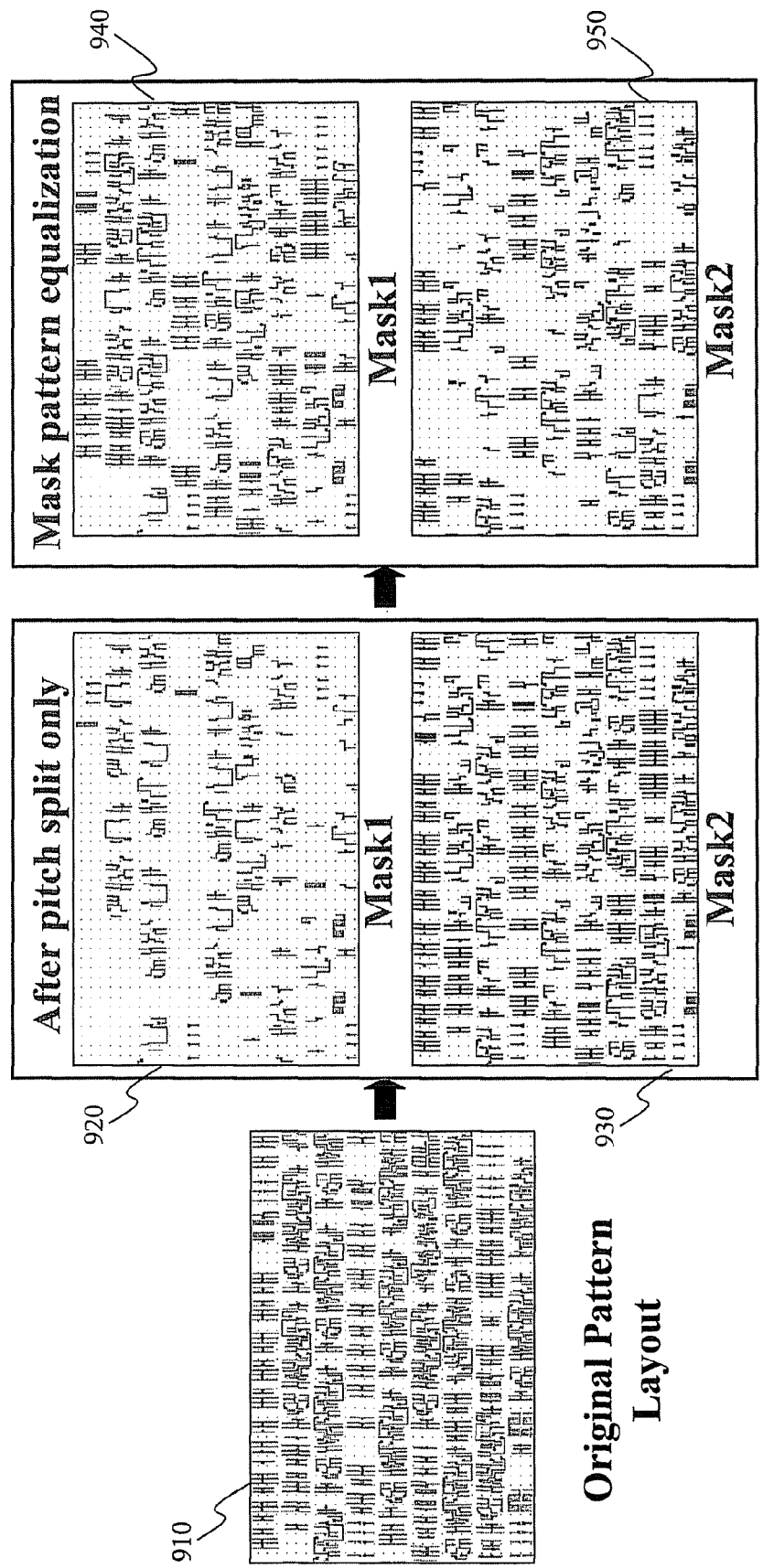
FIG. 9 is an example of masks generated from a pattern layout that was split with and without the mask pattern equalization step of FIG. 7.

Referring now to FIG. 9, illustrated are masks generated from a pattern layout 910 that was split with and without the mask pattern equalization step of FIG. 7. The origin pattern layout 910 may be split into two separate layouts according to a minimum pitch. A first mask (Mask1) and a second mask (Mask2) are generated from the two separate layouts. The first set of masks 920, 930 have been generated without the mask pattern equalization step of FIG. 7 (e.g., the features that did not require splitting were all added to Mask2 930). In this example, Mask1 920 has a much smaller pattern density than Mask2 930. The second set of masks 940, 950 have been generated with the mask pattern equalization step of FIG. 7 (e.g., the features that did not require splitting were added equally to Mask1 940 and Mask2 950). In this example, Mask1 940 has a similar pattern density as Mask2 950.

Figure 10:
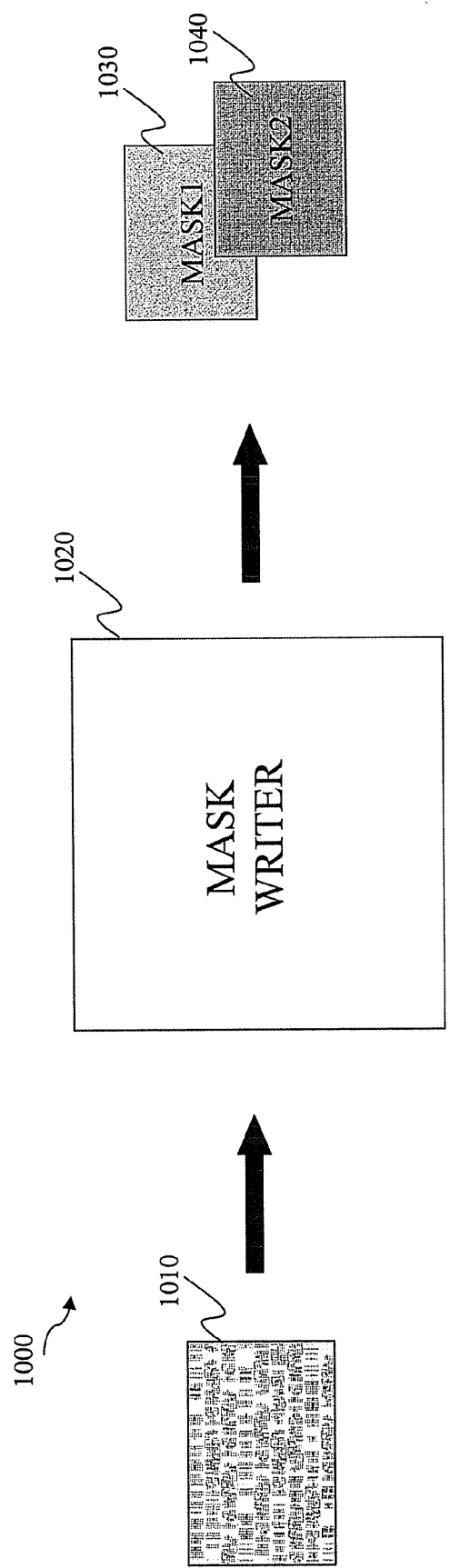
FIG. 10 is a system for generating multiple mask implementing the method of FIG. 1.

Referring now to FIG. 10, illustrated is a system 1000 for generating multiple mask implementing the method of FIG. 1. The system 1000 includes a pattern layout 1010 that is provided in a computer-aided format such as GDS format. The pattern layout 1010 is inputted into a mask writer 1020. The mask writer 1020 may comprise of all software and hardware components that are required to implement the method 100 of FIG. 1. For example, the mask writer 1020 comprises software that is programmed with instructions to perform all the steps in the method 100 of FIG. 1. Additionally, the mask writer 1020 comprises hardware to transfer the resulting layouts into a first mask 1030 and a second mask 1040. For example, the mask writer 1020 may use an electron beam for writing the layouts in electronic from to the first 1030 and second 1040 mask. It is understood that although the present embodiment uses two mask, the system is configured and operable to generate more than two masks.

Thus, a method for splitting a pattern layout is provided. The method comprises providing the pattern layout having a plurality of features, checking the pattern layout with a design rule check (DRC) to determine the features that require splitting, coloring the features that require splitting with a first color and a second color, resolving coloring conflicts by decomposing the feature with the coloring conflict and coloring the decomposed feature with the first and second color, generating a first mask with features of the first color and a second mask with features of the second color.

In some embodiments, the plurality of features include polygate lines, metal lines, contacts, or trenches. In other embodiments, the plurality of features are shaped as lines, line ends, contact holes, elbow shapes, T-shapes, or any combinations thereof. In other embodiments, the checking includes configuring the design rule check (DRC) to include a minimum pitch for adjacent contact holes. In still other embodiments, the checking includes configuring the design rule check (DRC) to include a minimum pitch for adjacent lines and a minimum spacing for line ends.

In other embodiments, the coloring includes coloring one of the adjacent features with the first color and coloring the other one of the adjacent features with the second color. In other embodiments, the coloring conflicts occur when the adjacent features that require splitting are of the same color. In still other embodiments, the generating is performed after resolving all coloring conflicts. In some embodiments, the method further comprises selecting the features of the pattern layout that do not require splitting, generating a mesh layout that defines areas of the first mask and areas of the second mask that are available for adding features to, equalizing and assigning the features that do not require splitting to the mesh layout, and adding the features that were equalized and assigned to the mesh layout to the corresponding first and second masks. In other embodiments, the method further comprises printing an image of the pattern layout from the first and second masks. In still other embodiments, the resolving coloring conflicts includes creating an overlap area in the decomposed feature. In some embodiments, the overlap area is shaped as a rectangle. In other embodiments, the overlap area is shaped as an elbow shape. In other embodiments, the overlap area is shaped as a T shape.

Also, a computer-readable medium having a plurality of instructions is provided. The instructions comprise of providing a pattern layout having a plurality of features, checking the pattern layout with a design rule check (DRC) to determine the features that require splitting, coloring the features that require splitting with a first color and a second color, resolving coloring conflicts by decomposing the feature with the coloring conflict and coloring the decomposed feature with the first color and the second color, and forming a first mask with features of the first color and a second mask with features of the second color.

In other embodiments, the computer-readable medium further comprises selecting the features of the pattern layout that do not require splitting, generating a mesh layout that defines areas of the first mask and areas of the second mask that are available for adding features to, equalizing and assigning the features that do not require splitting to the mesh layout, and adding the features that were equalized and assigned to the mesh layout to the corresponding first and second masks.

In some embodiments, the plurality of features include polygate lines, metal lines, contacts, or trenches. In some other embodiments, the plurality of features are shaped as lines, line ends, contact holes, elbow shapes, T-shapes, or any combinations thereof. In other embodiments, the design rule check (DRC) includes a minimum pitch for adjacent lines and a minimum spacing for line ends. In other embodiments, the design rule check (DRC) includes a minimum pitch for adjacent contact holes. In still other embodiments, the instructions for resolving coloring conflicts includes creating an overlap area in the decomposed feature. In some embodiments, the overlap area is shaped as a rectangle. In other embodiments, the overlap area is shaped as an elbow shape. In other embodiments, the overlap area is shaped as a T shape.

Additionally, a system for generating multiple masks is provided that comprises a pattern layout having a plurality of features and a mask writer. The mask writer is configured and operable for checking the pattern layout to select the features that require splitting into separate layouts, coloring the features that require splitting with a first color and a second color, the first color defines a first layout and the second color defines a second layout, resolving coloring conflicts with decomposition, the coloring conflicts occur when adjacent features that require splitting are of the same color, equalizing and assigning the features that do not require splitting into the first and second layouts, and forming a first mask representing the first layout and a second mask representing the second layout.

In some embodiments, the checking includes determining a pitch of adjacent features of the pattern layout. The adjacent features are selected for splitting if the pitch is less than a minimum pitch. In other embodiments, the resolving coloring conflicts includes decomposing one of the adjacent features into at least two components and coloring one of the components with the first color and coloring the other one of the components with the second color. In still other embodiments, the resolving coloring conflicts includes creating an overlap area for the at least two components. In some embodiments, the overlap area is shaped as a rectangle. In other embodiments, the overlap area is shaped as an elbow shape. In other embodiments, the overlap area is shaped as a T shape.

Several different advantages exist from these and other embodiments. In addition to providing an effective and efficient method for splitting a full chip pattern layout, the method does so with equalization so that the separate layouts reach a similar pattern density. Moreover, the method can be used to extend current exposure tools to print next generation design patterns as features become smaller and are spaced closer together. The method allows this by splitting these patterns into separate layouts and, thereby increasing the pitch of each separate layout.

Although only a few exemplary embodiments of this disclosure have been described in details above, those skilled in the art will readily appreciate that many modifications are possible in the exemplary embodiments without materially departing from the novel teachings and advantages of the present disclosure. It is understood that various different combinations of the above-listed processing steps can be used in combination or in parallel. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for splitting a pattern layout, the method comprising:
   providing the pattern layout having a plurality of features;
   checking, by a mask writer, the pattern layout with a design rule check (DRC) to determine the features that require splitting;
   coloring, by the mask writer, the features that require splitting with a first color and a second color;
   resolving, by the mask writer, coloring conflicts by decomposing a feature with a coloring conflict and coloring the decomposed feature with the first color and the second color;
   assigning, by the mask writer, the features that required splitting to a first mask layout and a second mask layout, wherein features of the first color are assigned to the first mask layout and features of the second color are assigned to the second mask layout;
   assigning, by the mask writer, the features that do not require splitting to one of a first area and a second area of an equalization layout, wherein the first area corresponds with areas of the first mask layout that are available for adding features and the second area corresponds with areas of the second mask layout that are available for adding features, such that the assigning equalizes pattern densities of the first area and the second area;
   assigning, by the mask writer, the features assigned to the first area to the first mask layout and the features assigned to the second area to the second mask layout; and
   forming, by the mask writer, a first mask based on the first mask layout and a second mask based on the second mask layout.

2. The method of claim 1, wherein the plurality of features include polygate lines, metal lines, contacts, or trenches.

3. The method of claim 1, wherein the plurality of features are shaped as lines, line ends, contact holes, elbow shapes, T-shapes, or any combinations thereof.

4. The method of claim 1, wherein the checking includes configuring the design rule check (DRC) to include a minimum pitch for adjacent contacts holes.

5. The method of claim 1, wherein the checking includes configuring the design rule check (DRC) to include a minimum pitch for adjacent lines.

6. The method of claim 5, wherein the checking includes configuring the design rule check (DRC) to include a minimum spacing for line ends.

7. The method of claim 1, wherein the coloring includes coloring adjacent features such that one of the adjacent features is colored with the first color and the other one of the adjacent features is colored with the second color.

8. The method of claim 1, wherein the coloring conflicts occur when adjacent features that require splitting are of the same color.

9. The method of claim 1, wherein the forming is performed after resolving all coloring conflicts.

10. The method of claim 1, wherein before the assigning the features assigned to the first and second areas to the first and second mask layouts, respectively, coloring the features assigned to the first area the first color and the features assigned to the second area the second color.

11. The method of claim 1, further comprises printing an image of the pattern layout in a photoresist layer of a wafer using the first and second masks.

12. The method of claim 1, wherein the resolving coloring conflicts includes creating an overlap area in the decomposed feature, wherein the overlap area is shaped as a rectangle, an elbow shape, or a T shape.

13. A computer-readable medium that stores a plurality of instructions for execution by at least one computer processor, the instructions comprising:
   providing a pattern layout having a plurality of features;
   checking the pattern layout with a design rule check (DRC) to determine the features that require splitting;
   coloring the features that require splitting with a first color and a second color;
   resolving coloring conflicts by decomposing the feature with the coloring conflict and coloring the decomposed feature with the first color and the second color;
   assigning the features that do not require splitting with the first color and the second color to equalize pattern densities of features of the first color and features of the second color, respectively; and forming a first mask with features of the first color and a second mask with features of the second color;
wherein the instruction for the assigning includes instructions for:
selecting the features of the pattern layout that do not require splitting;
generating a mesh layout that defines first and second areas, the first areas corresponding to areas of the first mask that are available for adding features to and the second areas corresponding to areas of the second mask that are available for adding features to;
equalizing and assigning the features that do not require splitting to the mesh layout; and
adding the features that were equalized and assigned to the mesh layout to the corresponding first and second masks.

14. The computer-readable medium of claim 13, wherein the plurality of features include polygate lines, metal lines, contacts, or trenches.

15. The computer-readable medium of claim 13, wherein the plurality of features are shaped as lines, line ends, contact holes, elbow shapes, T-shapes, or any combinations thereof.

16. The computer-readable medium of claim 13, wherein the design rule check (DRC) includes a minimum pitch for adjacent lines and a minimum spacing for line ends.

17. The computer-readable medium of claim 13, wherein the design rule check (DRC) includes a minimum pitch for adjacent contact holes.

18. The computer-readable medium of claim 13, wherein the instructions for resolving coloring conflicts includes creating an overlap area in the decomposed feature, wherein the overlap area is shaped as a rectangle, an elbow shape, or a T shape.

19. A system for generating multiple masks, the system comprising:
a pattern layout having a plurality of features; and
a mask writer configured and operable for:
checking the pattern layout to select the features that require splitting;
coloring the features that require splitting with a first color and a second color, wherein the first color defines features assigned to a first layout and the second color defines features assigned to a second layout;
resolving coloring conflicts with decomposition, wherein the coloring conflicts occur when adjacent features that require splitting are of the same color, wherein one of the adjacent features is decomposed, wherein the decomposed feature includes a first portion that is colored with one of the first and second colors and a second portion that is colored with the other one of the first and second colors;
equalizing and assigning the features that do not require splitting into the first and second layouts, wherein the equalizing and assigning includes:
generating an equalization layout that defines a first area and a second area, the first area corresponding to areas of the first mask that are available for adding features to and the second area corresponding to areas of the second mask that are available for adding features to,
equally assigning the features that do not require splitting to the first area and the second area, and
coloring the features assigned to the first area the first color and the features assigned to the second area the second color; and
forming a first mask representing the first layout and a second mask representing the second layout.

20. The system of claim 19, wherein the checking includes determining a pitch of adjacent features of the pattern layout, wherein the adjacent features are selected for splitting if the pitch is less than a minimum pitch.

21. The system of claim 19, wherein the checking includes determining a spacing for ends of adjacent features, wherein the adjacent features are selected for splitting if the spacing is less than a minimum spacing.

22. The system of claim 19, wherein the equalization layout is a mesh layout.

* * * * *